US010114092B2

(12) United States Patent
Seeber et al.

(10) Patent No.: US 10,114,092 B2
(45) Date of Patent: Oct. 30, 2018

(54) CONNECTION SYSTEM AND METHOD

(71) Applicant: General Electric Company, Schenectady, NY (US)

(72) Inventors: Derek Allan Seeber, Florence, SC (US); Anthony Mantone, Florence, SC (US); William Louis Einziger, Florence, SC (US); Edwin Legall, Florence, SC (US); Timothy Elden Wise, Florence, SC (US); Shahed Ashraf, Florence, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 545 days.

(21) Appl. No.: 14/820,918

(22) Filed: Aug. 7, 2015

(65) Prior Publication Data
US 2017/0038445 A1   Feb. 9, 2017

(51) Int. Cl.
*G01R 33/38* (2006.01)
*G01R 33/385* (2006.01)

(52) U.S. Cl.
CPC ................ *G01R 33/3858* (2013.01)

(58) Field of Classification Search
CPC .......... G01R 33/3415; G01R 33/34084; G01R 33/36; G01R 33/34007; G01R 33/3642; G01R 33/3692; G01R 33/34046; G01R 33/385; G01R 33/307; G01R 33/3621; G01R 33/48; G01R 33/3664; G01R 33/543; G01R 33/34; G01R 33/561; G01R 33/28; G01R 33/34076; G01R 33/3628; G01R 33/3657; G01R 33/465; G01R 33/481; G01R 33/5611; G01R 33/288; G01R 33/3678; G01R 33/44; G01R 33/46; G01R 33/4808; G01R 33/483; G01R 33/5607; G01R 33/5659; G01R 33/3403; G01R 33/34092; G01R 33/3815; G01R 33/422; G01R 33/5602; G01R 33/565; G01R 33/286; G01R 33/34053; G01R 33/34069;
(Continued)

(56) References Cited

U.S. PATENT DOCUMENTS 5,394,086 A * 2/1995 Patrick ................ G01R 33/385
324/318
5,474,068 A * 12/1995 Takamori ................ A61B 6/56
242/378.2
(Continued)

FOREIGN PATENT DOCUMENTS

CN        205120950 U       3/2016

OTHER PUBLICATIONS

Combined Search and Examination Report issued in connection with corresponding GB Application No. 1613049.4 dated Dec. 16, 2016.

*Primary Examiner* — Vinh Nguyen
(74) *Attorney, Agent, or Firm* — Grogan, Tuccillo & Vanderleeden LLP

(57) ABSTRACT

A connection system includes a connector electrically connected and fixedly secured to a gradient coil assembly of a magnetic resonance imaging device, a cable block fixedly secured to a magnet of the magnetic resonance imaging device substantially above the connector, and a cable having a first end electrically connected to the cable block and a second end received by the connector and forming an electrical connection between the connector and the cable block.

20 Claims, 4 Drawing Sheets

(58) Field of Classification Search
CPC .............. G01R 33/3453; G01R 33/387; G01R 33/341; G01R 33/56; G01R 33/365; G01R 33/3607; G01R 33/3614; G01R 33/546; G01R 33/4833; G01R 33/56366; G01R 31/2834; G01R 33/243; G01R 33/3858; G01R 33/446; G01R 33/4812; G01R 33/4816; G01R 33/4835; G01R 33/485; G01R 33/5616; G01R 33/56383; G01R 33/56518; A61N 1/086; A61N 1/3718; A61N 1/3925; A61N 2005/1055; A61N 2007/0004

See application file for complete search history.

(56) References Cited

U.S. PATENT DOCUMENTS

| | | |
|---|---|---|
| 6,954,068 B1 | 10/2005 | Takamori et al. |
| 7,568,947 B2 | 8/2009 | Schuster et al. |
| 7,677,924 B2 | 3/2010 | Schuster et al. |
| 8,057,251 B2 | 11/2011 | Kreher et al. |
| 8,471,561 B2 | 6/2013 | Schuster et al. |
| 9,241,765 B2 * | 1/2016 | Piron .................... A61B 8/0825 |
| 2012/0118630 A1 | 5/2012 | Jiang et al. |
| 2013/0090002 A1 | 4/2013 | Dietz et al. |

* cited by examiner

CONNECTION SYSTEM AND METHOD

BACKGROUND

Technical Field

Embodiments of the invention relate generally to magnetic resonance imaging. Particular embodiments relate to a system and method for securely connecting a cable to a gradient coil of a magnetic resonance imaging apparatus.

Discussion of Art

Magnetic resonance systems operate with coils for transmitting high-frequency pulses with nuclear resonance excitation and/or for receiving induced magnetic resonance signals. Typically, a magnetic resonance system has a superconducting coil to generate a basic magnetic field (B0) that is optimally homogeneous in an examination region, a whole body coil (also called body coil) installed at a fixed position for briefly imposing a pulsed RF field (B1) generally transverse to B0, and a number of small surface coils (also called local coils). To obtain information from which images of a patient can be generated, selected regions of the subject or patient to be examined are read out with gradient coils for each of three axes (e.g. X, Y roughly radial to the patient, Z in the longitudinal direction of the patient). The spatial coding in magnetic resonance tomography is achieved using a gradient coil system with three independently controllable, magnetically orthogonal gradient field coils. The gradient field coils may be collectively referred to as a "gradient coil." By overlaying the three freely-scalable fields (in three directions X, Y, Z) the orientation of the coding plane ('gradient field') can be freely selected. Typically, this gradient coil is spatially fixed in a casting compound in which it is sealed.

A high current must be supplied to the gradient coil to generate the gradient fields. The currents are several hundred amperes; for instance, currents of 500-1300 A are typical. Previous attempts have been made to produce the connection of the gradient coil by means of a high-current coaxial connection formed of two plug elements, namely a plug and a mating connector that can be detachably connected with the plug. The plug is located at the coaxial cable conductor to be connected while the mating connector (thus the socket) is typically provided at the gradient coil. To connect, the plug on the end of the coaxial cable is inserted into the mating connector of the gradient coil and secured thereto utilizing hardware such as nuts and bolts or other threaded connections. Often times, the connection may require torqueing to relatively exact settings. Such existing means of connecting the current-carrying cable and the gradient coil, however, may result in unintended detachment of the cable from the gradient coil due to mechanical vibrations and/or alternating electromagnetic forces at the individual plug elements or at the conductor-side plug contact. In addition, with existing connection schemes, the cable typically extends axially away from the gradient coil due to the nature of the components utilized, which requires the cable to then be bent at a substantially ninety degree angle to bring it beyond the outside diameter of the magnet. Given the gauge of the cable utilized, however, such bending is not easy.

In view of the above, there is a need for a system and method for securely and reliably connecting a current-carrying cable to a gradient coil of a magnetic resonance imaging apparatus.

BRIEF DESCRIPTION

In an embodiment, a connection system includes a connector electrically connected and fixedly secured to a gradient coil assembly of a magnetic resonance imaging device, a cable block fixedly secured to a magnet of the magnetic resonance imaging device substantially above the connector, and a cable having a first end electrically connected to the cable block and a second end received by the connector and forming an electrical connection between the connector and the cable block.

In another embodiment, a method is provided. The method includes the steps of fixedly securing a connector to a gradient coil assembly of a magnetic resonance imaging device, inserting a plug of a cable extending from a cable block into a receptacle in the connector to establish an electrical connection therebetween, and fixedly securing the cable block to an end face of a magnet of the magnetic resonance imaging device.

In an embodiment, a system is provided. The system includes a connector potted into a gradient coil assembly of a magnetic resonance imaging device, the connector having a radially-facing receptacle, a cable block fixedly secured to a magnet of the magnetic resonance imaging device generally above the connector, and a coaxial cable depending downwardly from the cable block and having a plug that is received in the receptacle of the connector.

DRAWINGS

The present invention will be better understood from reading the following description of non-limiting embodiments, with reference to the attached drawings, wherein below:

DETAILED DESCRIPTION

Figure 1:
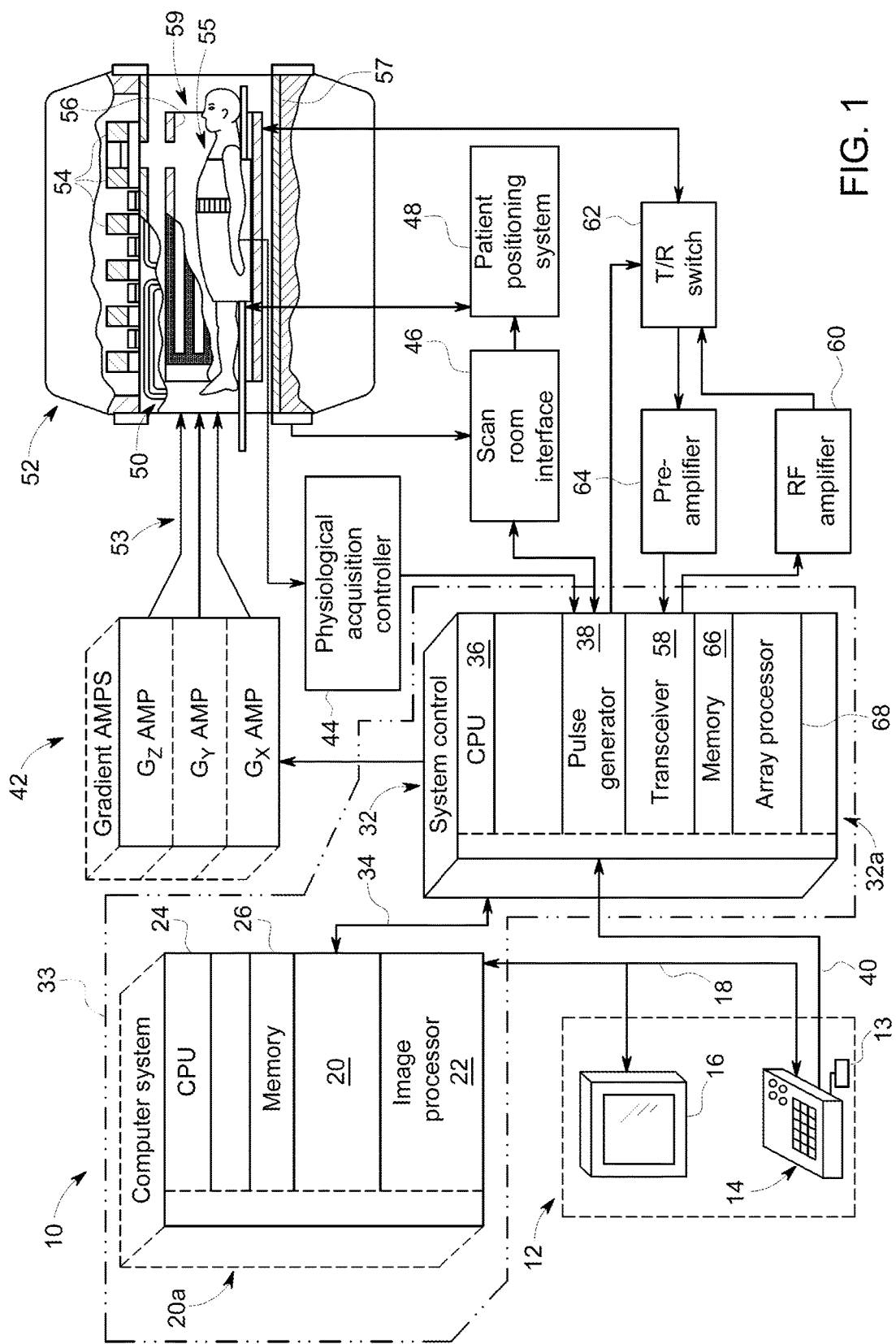
FIG. 1 depicts schematically an exemplary magnetic resonance imaging (MRI) system that incorporates embodiments of the invention.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to the connection of a current-carrying conductor to a gradient coil of a magnetic resonance imaging system, embodiments of the invention also are applicable for use in MRI systems, generally, and to connections, generally.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically connected," "electrical communication" or "electrically coupled" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a.

The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33.

The MRI system control 32 includes a set of modules connected together by a backplane 32a. These include a CPU module 36 as well as a pulse generator module 38. The CPU module 36 connects to the operator console 12 through a data link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body (transmit and receive) RF coil 56 (which, in operation, provides a transverse magnetic field B1 that is generally perpendicular to B0 throughout the target volume 55). As illustrated in FIG. 1, the gradient amplifiers 42 are electrically connected to the gradient coil assembly 50 via one or more electrical cables 53. A connection system, discussed hereinafter, provides the physical interconnection between the cable 53 and the gradient coil assembly 50. The RF coil 56 surrounds the target volume and defines a generally tubular-shaped patient receiving bore 59.

The MRI apparatus 10 also includes a surface (receive) coil 57, which may be single or multi-channel. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56, as well as by the dedicated receive coil 57, and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable the surface RF coil 57 to be used in either transmit mode or receive mode.

After the multi-channel RF coil 56 and/or the surface coil 57 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the data link 34 to the computer system 20 where it is stored in memory. In response to commands received from the operator console 12, this image data may be archived in long-term storage or it may be further processed by the image processor 22 and conveyed to the operator console 12 and presented on the display 16.

Figure 2:
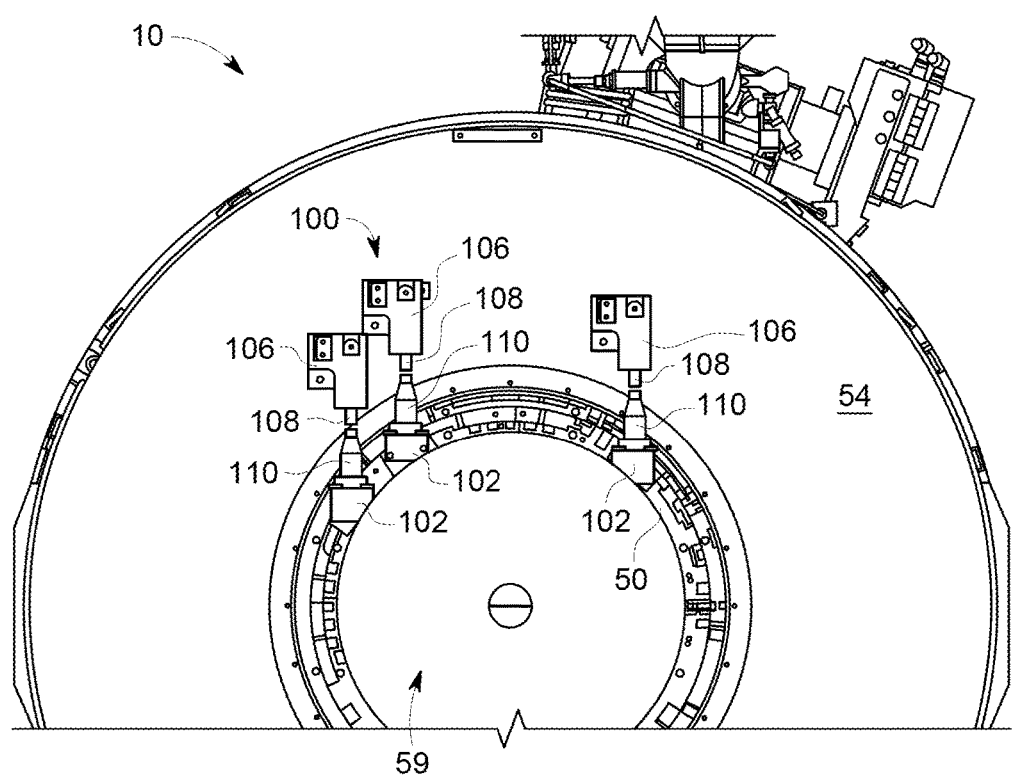
FIG. 2 is an end view of the magnetic resonance imaging system of FIG. 1, illustrating a gradient coil cable connection system according to an embodiment of the invention.
Figure 3:
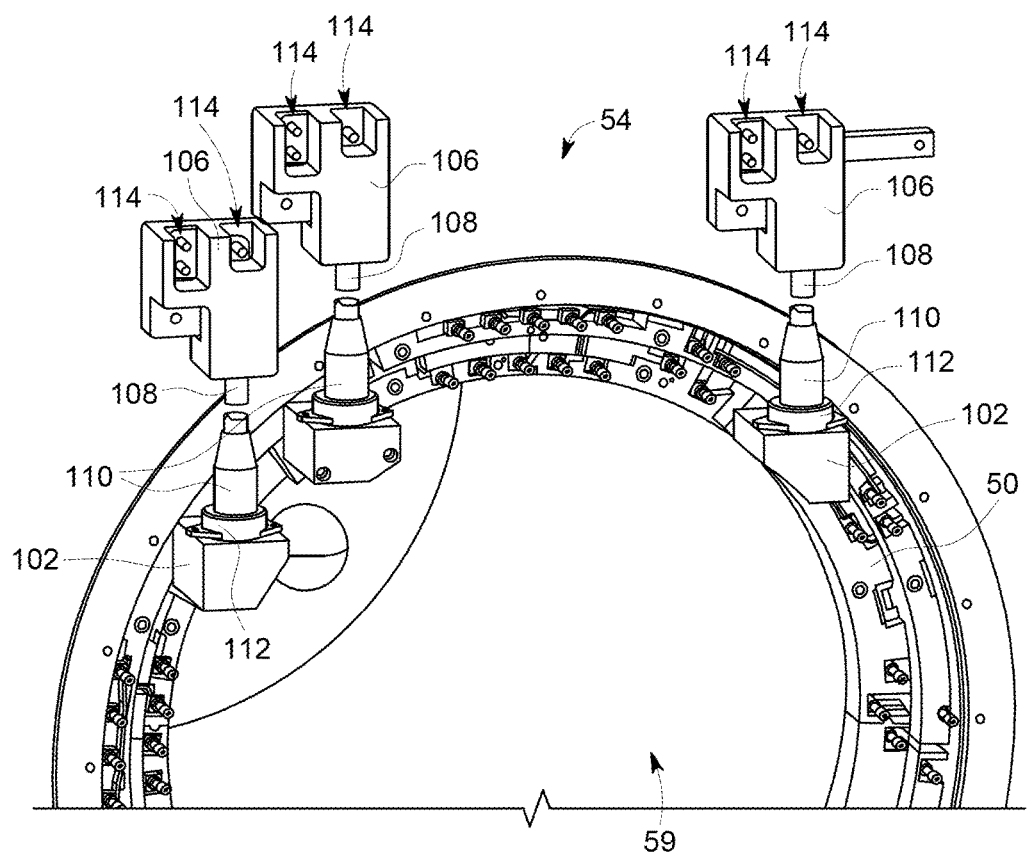
FIG. 3 is a detail, perspective view of the axial end of the magnetic resonance imaging system of FIG. 1, illustrating a gradient coil cable connection system.
Figure 4:
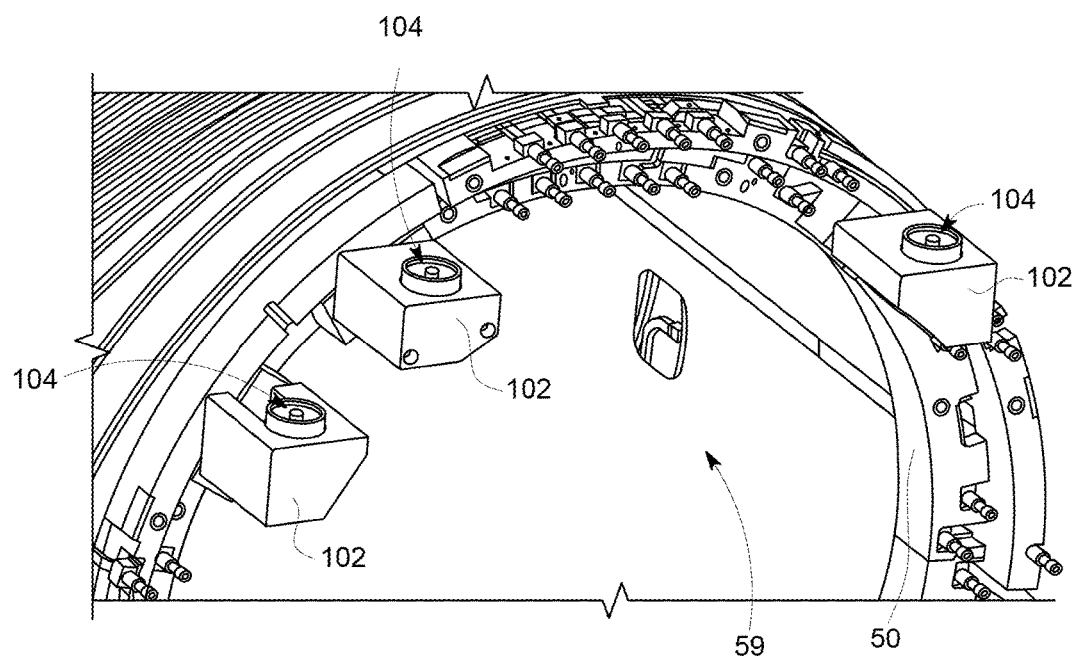
FIG. 4 is a detail, perspective view of an axial end of the magnetic resonance imaging system of FIG. 1, showing a connector of the gradient coil cable connection system.
Figure 5:
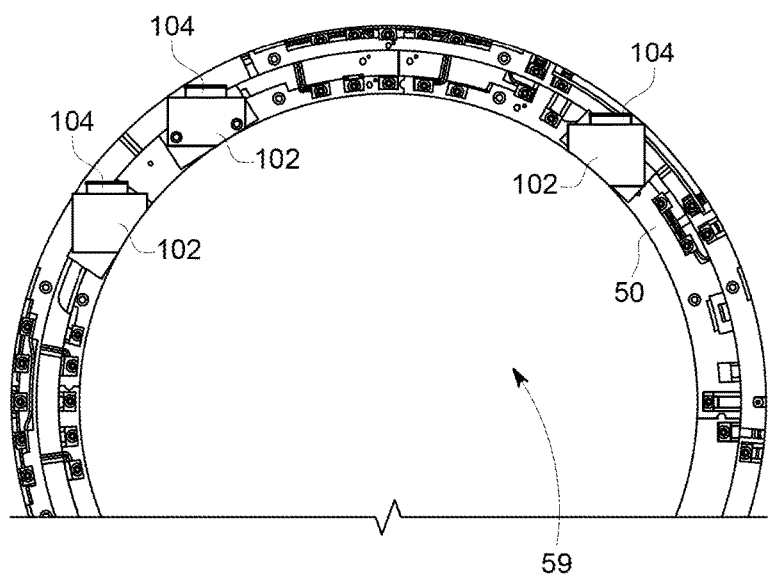
FIG. 5 is a detail, end view of the magnetic resonance imaging system of FIG. 1, showing the connector.

Referring now to FIGS. 2-5, a connection system 100 for connecting the gradient coil cable 53 to the gradient coil assembly 50 is illustrated. The connection system 100 includes a connector 102 having a receptacle 104 electrically coupled to the gradient coil assembly 50. In an embodiment, the receptacle 104 is a coaxial cable socket configured to receive the plug end of a coaxial cable, as discussed in detail hereinafter. As best shown in FIGS. 4 and 5, the connector 102 is potted into, or otherwise impregnated in, the gradient coil assembly 50 (with leads to the gradient coils therein), and is oriented such that the receptacle 104 faces radially outward from the patient-receiving bore 59 and extends beyond the magnet flange. As used herein, "radially-facing" means oriented radially relative to the patient-receiving bore and substantially orthogonal to a longitudinal axis of the bore. In an embodiment, the connector 102 is potted into the gradient coil assembly 50 so that the receptacle 50 faces directly upward. In an embodiment, the housing of the connector 102 is fire resistant.

In other embodiments, such as where the magnet is longer than the gradient coil assembly 50, the connector 102 may be potted into the gradient coil assembly 50 such that the receptacle 104 is axially facing. In either embodiment, the connector 102 is fixedly secured to the gradient coil assembly 50. In an embodiment, the height of the connector 102 is less than that of existing connectors, which removes assembly clearance issues that have customarily been present. In particular, the reduced height of the connector 102 allows the receptacle 104 to face radially upward, rather than axially.

With particular reference to FIGS. 2 and 3, the connection system 100 also includes a cable block 106 having a housing and a flexible coaxial cable 108 extending from the housing. The cable 108 has a first end electrically connected to the cable block 106 and a second end that terminates in a plug 110 that is sized and shaped so as to be received by the receptacle 104 in the connector 102 to establish an electrical connection therebetween. A rotatable boot 112 surrounds the plug 110 and is rotatable relative to the cable 108. The boot 112 provides a redundant connection between the cable block 106 and the connector 102, as discussed in detail hereinafter. In an embodiment, the coaxial cable 108 is designed to handle currents greater than 1000 Amps and 450 Arms.

As also shown in FIGS. 2 and 3, the cable block 106 includes a plurality of electrical terminals 114 electrically connected to the coaxial cable 108 which, in turn, allow the cable 108 to be connected to the gradient amplifier 42 via a pair of wires (e.g. gradient coil cables 53). For example, the terminals 114 may include an M10 stud electrically connected to the center conductor of the coaxial cable 108 and two M10 studs electrically connected to the shield conductor of the coaxial cable 108 for receiving gradient coil cables 53 running to the gradient amplifier 42. This configuration of the studs prevent the inadvertent switching of positive and negative wires running to the gradient amplifier 42 and provides a ground connection to the magnet.

As best shown in FIGS. 2 and 3, in an embodiment, the cable block 106 is fixedly attached to the end of the magnet 54 directly above the connector 102 using screws or other fasteners, with the coaxial able 108 depending downwardly from the cable block 106, so that the plug 110 may be inserted into the receptacle 104 from above. This arrangement minimizes the ability of a technician to improperly wire the connection to the gradient coil, as discussed hereinafter. Indeed, when connected, the cable 108 exits straight up from the receptacle 104, which obviates the need to bend the cable 108 to bring it outside of the magnetic field, as discussed hereinafter.

In use, the connector 102 is potted into the gradient coil assembly 50 so that the receptacle 104 is oriented radially and faces substantially upward. A technician may then insert the plug end 110 of the coaxial cable 108 into the receptacle 104 from above to establish an electrical connection therebetween, without the use of a torque wrench and hardware. The cable block 106 is then fixedly mounted to the end of the magnet 54 (e.g., to the magnet flange) using screws or other fasteners. In an embodiment, a spring-loaded clip may be utilized to prevent the screws from backing out due to vibration.

Fixedly mounting the cable block 106 to the end of the magnet 54 forces the coaxial cable 108, and the plug 110 thereof, to sit snugly and reliably inside the receptacle 104 in the connector 102. In particular, in an embodiment, the plug 110 must move approximately 1.5 inches vertically to disengage the connection. With the opposite end of the cable 108 bolted to the magnet with the M10 stud (via the cable block 106), and with the stiff coaxial cable, the connection is naturally engaged. Restraining the cable to the magnet flange actually prevents the cable from disengaging from the receptacle.

As alluded to above, the boot 112 on the cable 108 provides a redundant connection between the cable block 106 and the connector 102. In particular, in an embodiment, the boot 112 includes a flange having a plurality of apertures therein. Screws may be utilized to redundantly secure the boot 112, and thus the coaxial cable 108, directly to the connector 102. In other embodiments, a zip tie or cable tie may be utilized to secure the boot 112 directly to the connector 102. Other fastening means may also be utilized without departing from the broader aspects of the present invention. In an embodiment, the boot and plug overmold may be manufactured from a flame retardant material. The flame retardant material prevents any arcing from igniting anything else on the magnet or patient space and thus provides an added layer of safety. Once the connection between the cable block 106 and connector 102 is established via insertion of the plug 110 into the socket, and the cable block 106 is fixedly mounted to the magnet above the receptacle 104 a pair of wires extending from the gradient amplifier 42 (e.g., cable 53) may be connected to the terminals 114 on the cable block 106.

The connection system 100 therefore provides a secure and reliable electrical connection between the gradient amplifier 42 and the gradient coil assembly 50. As discussed above, existing systems and methods typically utilize a bolted joint to connect a coaxial cable running from the gradient amplifier to the gradient coil assembly, which requires components to be torqued to precise settings to ensure a reliable connection. In contrast to existing systems and methods, however, the connection system 100 of the present invention utilizes a connector 102 that is potted directly into the gradient coil assembly 50, obviating the need to utilize a bolted connection therebetween. Moreover, the simple plug and socket connection provides for an ease of assembly heretofore not seen in the art.

In addition, existing systems and methods typically utilize a coaxial cable that extends axially outward from the gradient coil assembly, which is then bent at a ninety degree angle upwards in order to position the cable beyond the outside diameter of the magnet and, thus, outside of the magnetic field. The coaxial cable is very thick and is not easily bent, especially over short lengths, however, which can present challenges during installation and can place a strain on the cable. The present invention obviates the need to bend the coaxial cable by orienting the connector 102 such that the receptacle 104 thereof faces radially outward and upward, not axially. Accordingly, the coaxial cable 108 may be inserted into the receptacle 104 from above, obviating the need to bend the cable to bring it outside of the outside diameter of the magnet. Accordingly, this configuration allows the cable 108 to extend directly upward in a straight line, facilitating installation.

As will be readily appreciated, fixedly securing the connector 102 to the gradient coil assembly 50 and fixedly securing the connector block 106 to the end of the magnet provides two fixed points on opposite ends of the coaxial cable 108, which serve to isolate the connection between the plug 110 and receptacle 104 from vibrations or other movements that could detrimentally affect the electrical connection therebetween. In particular, these two fixed points prevent vibrations or the like from propagating to the plug and receptacle connection, and prevent strain on the cable 108 or twisting of the cable 108 relative to the connector 102 that would normally result from such vibrations. In effect, these two fixed points restrain the cable 108 from disconnection from the receptacle 104. As a result, a secure and reliable connection may be realized. Moreover, directly securing the boot 112 to the connector 102 via screws or the like provides a redundant connection that further ensures reliability and prevents the cable 108 from becoming disconnected from the connector 102.

In addition to the above, utilizing a coaxial cable 108 that is short in length provides reduced costs, overall. In connection with the above, the coaxial connector 102 and the coaxial cable 108 are naturally force balanced between the inner and outer concentric cables in a magnetic field, as the positive current is balanced by the negative current in the same cable. Accordingly, the net force in the cable is zero, which removes a potential source of movement that could compromise the connection.

In an embodiment, a connection system includes a connector electrically connected and fixedly secured to a gradient coil assembly of a magnetic resonance imaging device, a cable block fixedly secured to a magnet of the magnetic resonance imaging device substantially above the connector, and a cable having a first end electrically connected to the cable block and a second end received by the connector and forming an electrical connection between the connector and the cable block. In an embodiment, the connector is potted into the gradient coil assembly. In an embodiment, the second end of the cable includes a plug and the connector includes a receptacle configured to receive the plug. In an embodiment, the receptacle faces radially outward relative to a patient-receiving bore of the magnetic resonance imaging device. In an embodiment, the cable is a coaxial cable. In an embodiment, the cable block may have at least one terminal configured to receive a wire for electrically connecting the cable block to a gradient amplifier of the magnetic resonance imaging device. In an embodiment, the system also includes a redundant connection between the cable and the connector. The redundant connection may include a rotatable boot integrally formed with the cable. The rotatable boot has a flange configured for direct coupling to the connector. In an embodiment, the flange is directly coupled to the connector via at least one screw. In an embodiment, the receptacle of the connector is positioned beyond a flange of the magnet.

In an embodiment, a method includes the steps of fixedly securing a connector to a gradient coil assembly of a magnetic resonance imaging device, inserting a plug of a cable extending from a cable block into a receptacle in the connector to establish an electrical connection therebetween, and fixedly securing the cable block to an end face of a magnet of the magnetic resonance imaging device. In an embodiment, the step of fixedly securing the connector includes orienting the connector so that the receptacle faces in a radial direction beyond a flange of the magnet. In an embodiment, the step of fixedly securing the connector includes potting the connector into the gradient coil assembly. In an embodiment, the method may also include the step of establishing a redundant connection between the cable and the connector. In an embodiment, the method may include the step of establishing a redundant connection includes securing the cable to the connector via at least one of a zip tie and a screw. In an embodiment, the step of inserting the plug into the receptacle includes bringing the plug towards the receptacle in a direction opposite the radial direction. In an embodiment, the cable is a coaxial cable. In an embodiment, the method may also include the step of electrically connecting the cable block to a gradient amplifier of the magnetic resonance imaging device.

In an embodiment, a system is provided. The system includes a connector potted into a gradient coil assembly of a magnetic resonance imaging device, the connector having a radially-facing receptacle, a cable block fixedly secured to a magnet of the magnetic resonance imaging device generally above the connector, and a coaxial cable depending downwardly from the cable block and having a plug that is received in the receptacle of the connector. In an embodiment, the system also includes a flange integrally formed with the coaxial cable, the flange being secured to the connector via a fastening member and providing for a redundant connection between the cable and the connector.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described method and apparatus, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A connection system, comprising:
a connector electrically connected and fixedly secured to a gradient coil assembly of a magnetic resonance imaging device;
a cable block fixedly secured to a magnet of the magnetic resonance imaging device substantially above the connector; and
a cable having a first end electrically connected to the cable block and a second end received by the connector and forming an electrical connection between the connector and the cable block.

2. The connection system of claim 1, wherein:
the connector is potted into the gradient coil assembly.

3. The connection system of claim 2, wherein:
the second end of the cable includes a plug; and
the connector includes a receptacle configured to receive the plug.

4. The connection system of claim 3, wherein:
the receptacle faces radially outward relative to a patient-receiving bore of the magnetic resonance imaging device.

5. The connection system of claim 4, wherein: the cable is a coaxial cable.

6. The connection system of claim 5, wherein:
the cable block has at least one terminal configured to receive a wire for electrically connecting the cable block to a gradient amplifier of the magnetic resonance imaging device.

7. The connection system of claim 5, further comprising:
a redundant physical connection between the cable and the connector.

8. The connection system of claim 7, wherein:
the redundant connection includes a rotatable boot integrally formed with the cable.

9. The connection system of claim 8, wherein:
the rotatable boot is directly secured to the connector.

10. The connection system of claim 1, wherein:
the receptacle of the connector is positioned beyond an outside diameter of the magnet.

11. A method, comprising the steps of:
fixedly securing a connector to a gradient coil assembly of a magnetic resonance imaging device;
inserting a plug of a cable extending from a cable block into a receptacle in the connector to establish an electrical connection therebetween; and
fixedly securing the cable block to an end face of a magnet of the magnetic resonance imaging device.

12. The method according to claim 11, wherein:
the step of fixedly securing the connector includes orienting the connector so that the receptacle faces in a radial direction beyond a flange of the magnet.

13. The method according to claim 12, wherein:
the step of fixedly securing the connector includes potting the connector into the gradient coil assembly.

14. The method according to claim 13, further comprising the step of:
establishing a redundant connection between the cable and the connector.

15. The method according to claim 14, wherein:
the step of establishing a redundant connection includes securing a rotatable boot integrally formed with the cable to the connector.

16. The method according to claim 12, wherein:
inserting the plug into the receptacle includes bringing the plug towards the receptacle in a direction opposite the radial direction.

17. The method according to claim 11, wherein:
the cable is a coaxial cable.

18. The method according to claim 11, further comprising the step of:
electrically connecting the cable block to a gradient amplifier of the magnetic resonance imaging device.

19. A system, comprising:
a connector potted into a gradient coil assembly of a magnetic resonance imaging device, the connector having a radially-facing receptacle;
a cable block fixedly secured to a magnet of the magnetic resonance imaging device generally above the connector; and
a coaxial cable depending downwardly from the cable block and having a plug that is received in the receptacle of the connector.

20. The system of claim 19, further comprising:
a rotatable boot integrally formed with the coaxial cable, the rotatable boot being secured to the connector and providing a redundant connection between the cable and the connector.

* * * * *